US009785615B1

(12) United States Patent
Merced Grafals et al.

(10) Patent No.: US 9,785,615 B1
(45) Date of Patent: Oct. 10, 2017

(54) MEMRISTIVE COMPUTATION OF A VECTOR CROSS PRODUCT

(71) Applicant: Hewlett Packard Enterprise Development LP, Houston, TX (US)

(72) Inventors: Emmanuelle J. Merced Grafals, Palo Alto, CA (US); Noraica Davila Melendez, Palo Alto, CA (US); John Paul Strachan, San Carlos, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/191,669

(22) Filed: Jun. 24, 2016

(51) Int. Cl.
*G06G 7/16* (2006.01)
*G06F 7/32* (2006.01)
*G06F 17/16* (2006.01)
*G11C 13/00* (2006.01)

(52) U.S. Cl.
CPC ............ *G06F 17/16* (2013.01); *G11C 13/004* (2013.01); *G11C 13/0069* (2013.01)

(58) Field of Classification Search
CPC .. G06F 17/16; G11C 13/0004; G11C 13/0069
USPC ................................................ 708/835, 520
See application file for complete search history.

(56) References Cited

U.S. PATENT DOCUMENTS

| 7,983,065 B2* | 7/2011 | Samachisa | B82Y 10/00 365/130 |
| 2009/0163826 A1* | 6/2009 | Mouttet | G11C 11/54 600/544 |

FOREIGN PATENT DOCUMENTS

WO    WO 2016064406 A1 *  4/2016  .......... G11C 7/1006

* cited by examiner

*Primary Examiner* — Tan V. Mai
(74) *Attorney, Agent, or Firm* — Hewlett Packard Enterprise Patent Department

(57) ABSTRACT

Memristive computation of a cross product is disclosed. One example is a crossbar array of memory elements that include a number of column lines perpendicular to a number of row lines, a memory element located at each intersection of a row line and a column line. A programming voltage is applied at each memory element to change a resistance value to represent a respective entry in a skew symmetric matrix representing a first vector, and an input voltage is applied along each row line to represent a dimensional component of a second vector. Sensors located at each column line measure output voltages along column lines, where the output voltages are generated by applying input voltages received by memory elements located along the row line to resistance values of the respective memory elements. Differential amplifiers collate the output voltages for pairs of sensors to generate dimensional components of the cross product.

20 Claims, 7 Drawing Sheets

MEMRISTIVE COMPUTATION OF A VECTOR CROSS PRODUCT

BACKGROUND

Crossbar arrays of memristors may be used in a variety of applications, including non-volatile solid state memory, programmable logic, signal processing, control systems, pattern recognition, and other applications.

DETAILED DESCRIPTION

Figure 1:
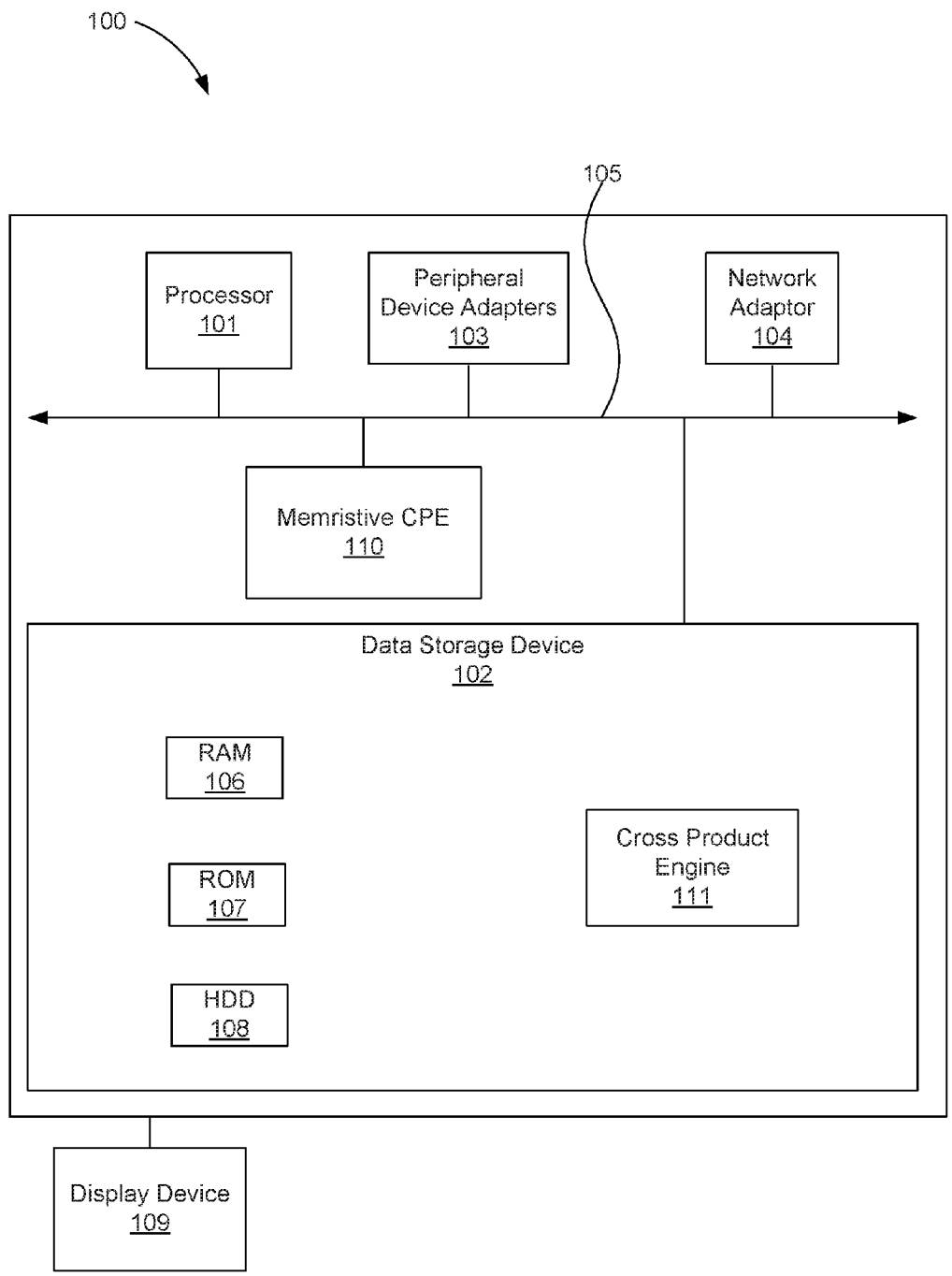
FIG. 1 is a diagram of a computing system for determining a cross product, according to one example of the principles described herein.

Crossbar arrays of memristors may be used in a variety of applications, including non-volatile solid state memory, programmable logic, signal processing, control systems, pattern recognition, and other applications. The present application is directed to a memristive crossbar array used to determine a cross product of, for example, a number of input matrix values and a number of second vector values. In other words, a memristive crossbar array can be used to perform cross product computations.

For example, an input voltage signal along each row of the crossbar array is weighted by the conductance of the memristive devices in each column and accumulated as the current output from each column. Accordingly, the memristive crossbar array includes a number of row lines and a number of column lines perpendicular to the row lines. Memristive memory devices are coupled between the row lines and the column lines at the intersections. The memristive crossbar array is coupled to a differential amplifier to determine a vector output.

A physical system that utilizes memristor cell arrays for accelerating cross (vector) product operations is described. A first vector is represented as a skew-matrix which is then multiplied with a second vector to compute the cross product. The skew symmetric matrix is represented using the conductance of memristor cells in a cross bar array, while the second vector is represented by the voltage biases applied at each row. Some applications include parallel computations of a plurality of cross products.

A specific example is given as follows. A first vector may be represented as a skew matrix. The memristive memory elements receive a number of programming voltages along row lines. The programming voltage applied at each memory element changes a conductance value of the memory element, where the conductance value represents a respective entry in the skew symmetric matrix representing the first vector. During operation, an input voltage is passed along the row lines, the input voltage representing dimensional component of a second vector to be multiplied by the skew matrix. An output current for each column is determined from Ohm's law using the conductance of the memristor and the input voltage. A sensor located at each column line measures an output voltage along the column line, where the output voltage is generated by applying input voltages received by memory elements located along the row line to conductance values of the respective memory elements. For example, the sensor may receive the output current and convert it to an output voltage. In determining the output, a differential amplifier connected to pairs of sensors collates measured output voltages for respective pairs of column lines to generate dimensional components of the cross product of the first vector and the second vector. The output equals a cross product of the first vector and the second vector.

As used in the present specification and in the appended claims, the term "memristor" may refer to a passive two-terminal circuit element that maintains a functional relationship between the time integral of current, and the time integral of voltage.

Further, as used in the present specification and in the appended claims, the term "cross product" is meant to be understood broadly as the product of two initial vectors to form a third vector perpendicular to both initial vectors. Although the cross product can be generalized to n-dimensions using exterior algebra, the present techniques are directed to vectors in three-dimensional space, $\mathbb{R}^3$, where it has a wide number of applications in areas such as geometrical computation, engineering, physics, and computer graphics.

Still further, as used in the present specification and in the appended claims, the term "memristive cross product engine" is meant to be understood broadly as a cross product engine that includes a memristive crossbar array.

For two vectors $\vec{a}=a_1 i+a_2 j+a_3 k$ and $\vec{b}=b_1 i+b_2 j+b_3 k$ in a three-dimensional space, where i, j, k are basis vectors, the cross product between $\vec{a}$ and $\vec{b}$ may be computed as:

$$\vec{a} \times \vec{b} = \begin{vmatrix} i & j & k \\ a_1 & a_2 & a_3 \\ b_1 & b_2 & b_3 \end{vmatrix} = \qquad \text{(Eqn. 1)}$$

$$(a_2 b_3 - a_3 b_2)i + (a_3 b_1 - a_1 b_3)j + (a_2 b_1 - a_1 b_2)k.$$

This vector operation may also be expressed as a matrix multiplication by replacing one of the vectors, say $\vec{a}$, with a skew symmetric matrix, given by:

$$\vec{a} \times \vec{b} = \begin{bmatrix} 0 & -a_3 & a_2 \\ a_3 & 0 & -a_1 \\ -a_2 & a_1 & 0 \end{bmatrix} \begin{bmatrix} b_1 \\ b_2 \\ b_3 \end{bmatrix} = \begin{bmatrix} a_2 b_3 - a_3 b_2 \\ a_3 b_1 - a_1 b_3 \\ a_2 b_1 - a_1 b_2 \end{bmatrix} \qquad \text{(Eqn. 2)}$$

where each row in the resulting column vector is the corresponding dimension component.

Although both methods yield identical results, the matrix method may be implemented in physical hardware using the architecture described herein. The skew symmetric matrix may be represented using the conductance of memristor cells in a cross bar array, while the vector $\vec{b}$ may be represented by the voltage biases applied at each row. These and other techniques are described in detail herein.

A cross product calculation is a computationally expensive task for a digital computer. This may be especially true when the matrices are not sparse or symmetric, such as in the case of dense matrices. A symmetric matrix is a square matrix that is equal to its transpose. Sparse matrices are matrices in which most of the elements are zero. In contrast, if most of the elements in the matrix are nonzero, then the matrix is considered dense.

In the following detailed description, reference is made to the accompanying drawings which form a part hereof, and in which is shown by way of illustration specific examples in which the disclosure may be practiced. It is to be understood that other examples may be utilized, and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

FIG. 1 is a diagram of a computing system 100 for determining a cross product, according to one example of the principles described herein. The computing system 100 may be implemented in an electronic device. Examples of electronic devices include servers, desktop computers, laptop computers, personal digital assistants (PDAs), mobile devices, smartphones, gaming systems, internet of things (IoT) sensors, and tablets, among other electronic devices.

The computing system 100 may be utilized in any data processing scenario including, stand-alone hardware, mobile applications, through a computing network, or combinations thereof. Further, the computing system 100 may be used in a computing network, a public cloud network, a private cloud network, a hybrid cloud network, other forms of networks, or combinations thereof. In one example, the methods provided by the computing system 100 are provided as a service over a network by, for example, a third party. In this example, the service may include, for example, the following: a Software as a Service (SaaS) hosting a number of applications; a Platform as a Service (PaaS) hosting a computing platform including, for example, operating systems, hardware, and storage, among others; an Infrastructure as a Service (IaaS) hosting equipment such as, for example, servers, storage components, network, and components, among others; application program interface (API) as a service (APIaaS), other forms of network services, or combinations thereof. The present systems may be implemented on one or multiple hardware platforms, in which the modules in the system can be executed on one or across multiple platforms. Such modules can run on various forms of cloud technologies and hybrid cloud technologies or offered as a SaaS (Software as a service) that can be implemented on or off the cloud. In another example, the methods provided by the computing system 100 are executed by a local administrator.

In some examples, the computing system 100 includes various hardware components. Among these hardware components may be a number of processors 101, a number of data storage devices 102, a number of peripheral device adapters 103, and a number of network adapters 104. These hardware components may be interconnected via a number of busses and/or network connections. In one example, the processor 101, data storage device 102, peripheral device adapters 103, and a network adapter 104 may be communicatively coupled via a bus 105.

The processor 101 may include the hardware architecture to retrieve executable code from the data storage device 102 and execute the executable code. The executable code may, when executed by the processor 101, cause the processor 101 to implement at least the functionality of applying a number of programming voltages at each memory element to change a conductance value of the memory element, where the conductance value represents a respective entry in a skew symmetric matrix representing a first vector. The executable code may, when executed by the processor 101, also cause the processor 101 to implement at least the functionality of applying a number of input voltages along each row line, the input voltages representing a dimensional component of a second vector. The executable code may, when executed by the processor 101, also cause the processor 101 to implement at least the functionality of a sensor located at each column line to measure output voltages along the column line, where the output voltages are generated upon receipt of the input voltages by memory elements located along the row line based on the conductance values of the respective memory elements. The executable code may, when executed by the processor 101, also cause the processor 101 to collate measured output voltages for respective pairs of column lines to generate dimensional components of the cross product of the first vector and the second vector. The functionality of the computing system 100 is in accordance to the methods of the present specification described herein. In the course of executing code, the processor 101 may receive input from and provide output to a number of the remaining hardware units.

The data storage device 102 may store data such as executable program code that is executed by the processor 101 or other processing device. As described herein, the data storage device 102 may specifically store computer code representing a number of applications that the processor 101 executes to implement at least the functionality described herein.

The data storage device 102 may include various types of memory modules, including volatile and nonvolatile memory. For example, the data storage device 102 of the present example includes Random Access Memory (RAM) 106, Read Only Memory (ROM) 107, and Hard Disk Drive (HDD) memory 108. Many other types of memory may also be utilized, and the present specification contemplates the use of many varying type(s) of memory in the data storage device 102 as may suit a particular application of the principles described herein. In certain examples, different types of memory in the data storage device 102 may be used for different data storage needs. For example, in certain examples the processor 101 may boot from Read Only Memory (ROM) 107, maintain nonvolatile storage in the Hard Disk Drive (HDD) memory 108, and execute program code stored in Random Access Memory (RAM) 106.

The data storage device 102 may include a computer readable medium, a computer readable storage medium, or a non-transitory computer readable medium, among others. For example, the data storage device 102 may be, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters 103, 104 in the computing system 100 enable the processor 101 to interface with various other hardware elements, external and internal to the computing system 100. For example, the peripheral device adapters 103 may provide an interface to input/output devices, such as, for example, display device 109, a mouse, or a keyboard. The peripheral device adapters 103 may also provide access to other external devices such as an external storage device, a number of network devices such as, for example, servers, switches, and routers, client devices, other types of computing devices, and combinations thereof.

The display device 109 may be provided to allow a user of the computing system 100 to interact with and implement the functionality of the computing system 100. The peripheral device adapters 103 may also create an interface between the processor 101 and the display device 109, a printer, or other media output devices. The network adapter 104 may provide an interface to other computing devices within, for example, a network, thereby enabling the transmission of data between the computing system 100 and other devices located within the network.

The computing system 100 may, when executed by the processor 101, display the number of graphical user interfaces (GUIs) on the display device 109 associated with the executable program code representing the number of applications stored on the data storage device 102. The GUIs may display, for example, interactive screenshots that allow a user to interact with the computing system 100 to input matrix and vector values in association with a memristive cross product engine (CPE) 110. Additionally, via making a number of interactive gestures on the GUIs of the display device 109, a user may obtain a cross product value based on the input data. Examples of display devices 109 include a computer screen, a laptop screen, a mobile device screen, a personal digital assistant (PDA) screen, and a tablet screen, among other display devices 106.

The computing system 100 may further include a memristive cross product engine (CPE) 110. As will be described in more detail herein, the memristive CPE 110 includes a number of elements including a number of memristors that function together within an array to perform a cross product of two or more vectors. The memristive CPE 110 may be used in a number of applications. For example, the memristive CPE 110 may be used in computational geometry and computer graphics, for example, to calculate the normal of a triangle or polygon, the distance of two skew lines, and/or to determine the sign of acute angles. As another example, the memristive CPE 110 may be used in sensors and robotics, for example, to control rotation and movement of robotic arms, and for estimating direction of arrival in antennas and photovoltaic systems. Also, for example, the memristive CPE 110 may be used in simulation and models of 3D systems, where it may form the basis for solving physics equations, such as angular momentum, torque, rigid motions, Lorentz forces, Maxwell's equations, and/or Stokes' law. In some example, the memristive CPE 110 may be used in vector calculus, for example, to compute a curl vector operator and/or to calculate triple vector products.

Although the memristive CPE 110 is depicted as being a device internal to the computing system 100, in another example, the memristive CPE 110 may be a peripheral device coupled to the computing system 100 or included within a peripheral device coupled to the computing system 100.

The computing system 100 further includes a number of components used in the implementation of the systems and methods described herein. The various components within the computing system 100 include executable program code that may be executed separately. In this example, the various components may be stored as separate computer program products. In another example, the various components within the computing system 100 may be combined within a number of computer program products; each computer program product including a number of the components.

The computing system 100 may include a cross product engine 111 to, when executed by the processor 101, assist in the functionality of the memristive CPE 110. The cross product engine 111, for example, receives a number of input values representing a matrix to be processed in a cross product mathematical calculation. The cross product engine 111 may send the input values to the memristive CPE 110 as programming voltages to a number of memristors within the memristive array of the CPE 110 to program the memristors. The cross product engine 111 may further obtain a value representing the cross product, and convey that value as data to the computing system 100 or another computing device for analysis or further processing.

Figure 2:
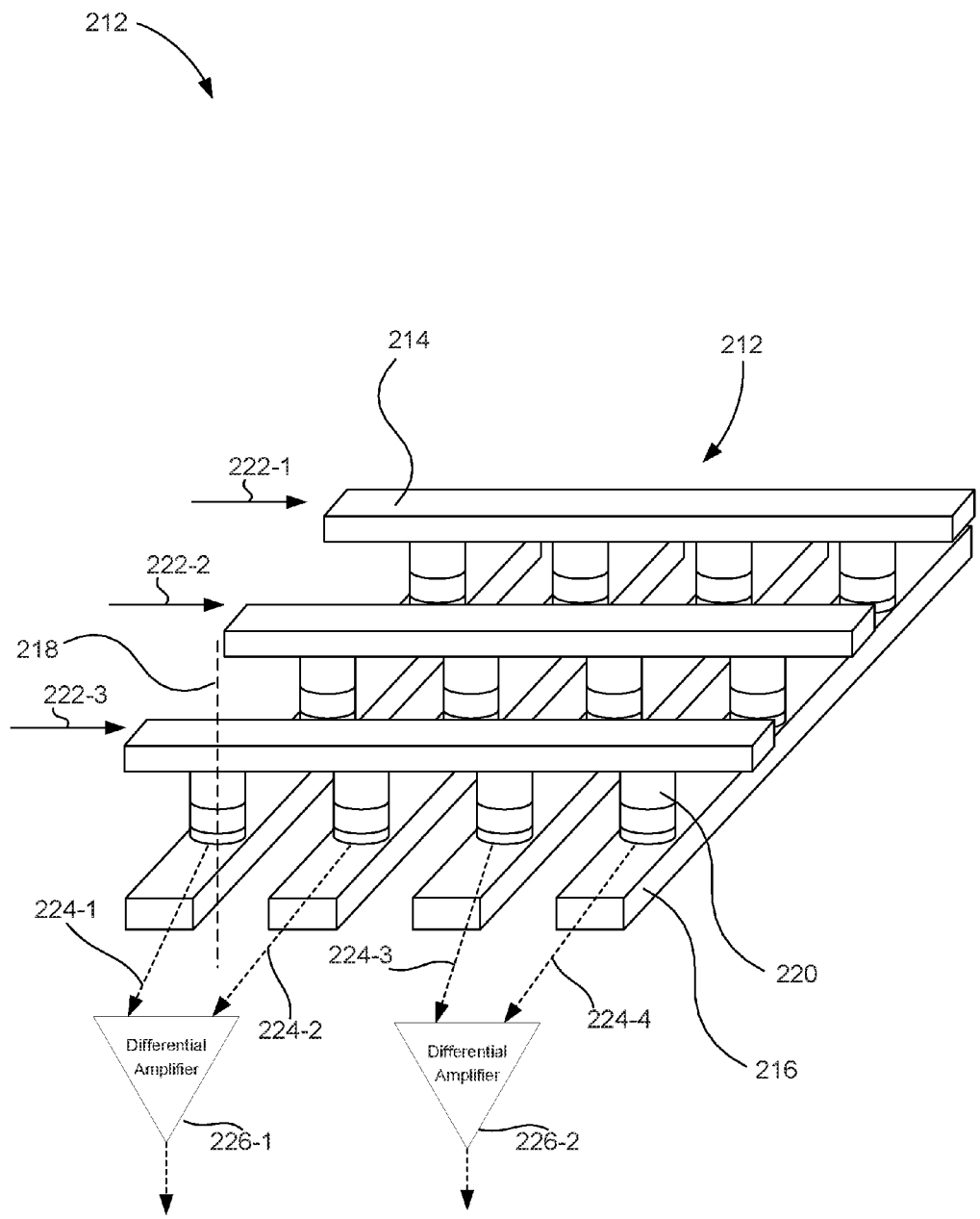
FIG. 2 is a diagram of a memristive crossbar array used within the memristive cross product engine (CPE) of the computing system of FIG. 1, according to one example of the principles described herein.

FIG. 2 is a diagram of a memristive crossbar array 212 used within the memristive cross product engine (CPE) (FIG. 1, 110) of the computing system (FIG. 1, 100) of FIG. 1, according to one example of the principles described herein. The memristive crossbar array 212 may include a number of electrically conductive row lines 214 and a number of electrically conductive column lines 216 that are perpendicular to the electrically conductive row lines 214. Even though three row lines 214 and four column lines 216 are depicted in FIG. 2, any number of row lines 214 and column lines 216 may be present in the memristive crossbar array 212. The row lines 214 and column lines 216 intersect at junctions as indicated by the dashed line 218. A number of memristive memory devices or "memristors" 220 are located at the junctions (or intersections) 218 and electrically couple the row lines 214 to the column lines 216.

Memristance is a property of the electronic component referred to as a memristor 220. If charge flows in one direction through a circuit, the resistance of that component of the circuit will increase. If charge flows in the opposite direction in the circuit, the resistance will decrease. If the flow of charge is stopped by turning off the applied voltage, the component will "remember" the last resistance that it had, and when the flow of charge starts again the resistance of the circuit will be what it was when it was last active. A memristor 220 is a resistor device whose resistance can be changed.

The conductance channels in the memristors 220 may be formed in each of the memristors 220 and the memristors 220 may be individually addressed as bits. A crossbar is an array of switches that connect each wire in one set of parallel wires to every member of a second set of parallel wires that intersects the first set. In the example of FIG. 2, the row lines 214 and the column lines 216 are perpendicular with respect to each other, but the row lines 214 and the column lines 216 may intersect at any angle.

The memristors 220 may be built at the micro- or nano-scale and used as a component in a wide variety of electronic circuits, such as, bases for memories and logic circuits. When used as a basis for memories, the memristors 220 may be used to store a bit of information, 1 or 0. When used as a logic circuit, as described herein, the memristors 220 may be employed to represent bits in a field programmable gate array, as the basis for a wired-logic programmable logic array, or, as described herein, as a cross product engine. The memristors 220 disclosed herein may also find use in a wide variety of other applications. The memristors 220 may be fabricated through any reasonably suitable fabrication process, such as, for example, chemical vapor deposition, sputtering, etching, lithography, or other methods of forming memristors.

The memristive crossbar array 212 may be used in computing a cross product. For example, a first vector $\vec{a}$ may be represented as a skew-symmetric matrix, as shown in Eqn. 2. The conductance values of memristors 220 within the crossbar array 212 may represent the matrix values for the skew symmetric matrix that represents the first vector $\vec{a}$. An input voltage may be passed along each row line, the combination of input voltages representing a second vector $\vec{b}$ to be multiplied by the first vector (i.e., the conductance of the memristors 220). The cross product of the first vector and the second vector may be replicated by multiplying the conductance of each memristor 220 by the second vector voltages, and collecting the outputs along column lines 216 of the memristive crossbar array 212 as output currents. For example, the output current of a particular column line 216 may be indicated by the following relationship:

$$V_{out\_j} = -R_f \sum_i V_{in\_i} \times \frac{1}{R_{ij}} \quad \text{(Eqn. 3)}$$

In Eqn. 3, $V_{out\_j}$ represents the output voltage at a column line 216 "j," $R_f$ represents a resistance of a sensor at the output (224-1, 224-2, 224-3, 224-4), $V_{in\_j}$ represents an input voltage at a row line 214 "i," and $R_{ij}$ represents a resistance of a memristor 200 such that $1/R_{ij}$ represents a conductance value of the memristors 220 at row "i" and column "j." Pairs of outputs 224 may be collated by differential amplifiers 226 to output dimensional components of a vector that represents a cross product of the first vector with the second vector.

To effectuate the cross product, each memristor 220 may receive a number of input signals. Specifically, each row line 214 may receive a programming voltage, and an input voltage. For simplicity, in FIG. 2 a single line 222 is used to represent the various input signals. More specifically, a first line 222-1 indicates a first programming voltage, and a first input voltage. Similarly, a second and third line 222-2, 222-3 represent second and third programming voltages, and input voltages, respectively.

A programming voltage may be used to change the resistance values at each individual memristor 220 at each intersection in the crossbar array 212 to create a representation (e.g., a mapping) of a mathematical matrix in which each conductance value at each memristor 220 represents a value within the matrix. This change in resistance among the individual memristors 220 is an analog change from a low-to-high value or a high-to-low value. In this manner, the memristors 220 are "memory resistors" in that they "remember" the last resistance that they had. In one example, the memristors 220 within the crossbar array 212 may be set to any number of resistance levels. For example, some memristors 220 may be set to a resistance level of approximately 1,000 ohms ($\Omega$) while other memristors 220 may be set to a resistance level of approximately 1,000,000$\Omega$. Using a programming voltage to set the memristors 220 to different resistance levels creates a mapping between a matrix of values and the resistance level. For example distinct resistance levels may represent distinct values in a matrix.

An input voltage may be used to multiply a matrix value by a vector value at each memristor 220 involved in the calculation. The input voltages may be applied to the row lines 214 of the memristive crossbar array 212. The input voltages may represent a second vector to be multiplied by the matrix values representing the first vector, which matrix values are represented by the memristor 220 resistances set by the programming voltages. In one example, the input voltages have a relatively lower voltage value than the programming voltages used to program the memristors 220 such that the voltage level applied by the input voltages does not change the resistance values of the memristors 220 as programmed by the programming voltages. The input voltages act as read signals in this manner by not changing the resistance values of the memristors 220.

As will be described in more detail in FIG. 3, the input voltages interact with the memristors 220 and a resulting output 224 is collected at the end of each column line 216. These outputs 224 are then passed through differential amplifiers 226 to produce the resultant vector that represents the cross product of the first vector with the second vector.

Figure 3:
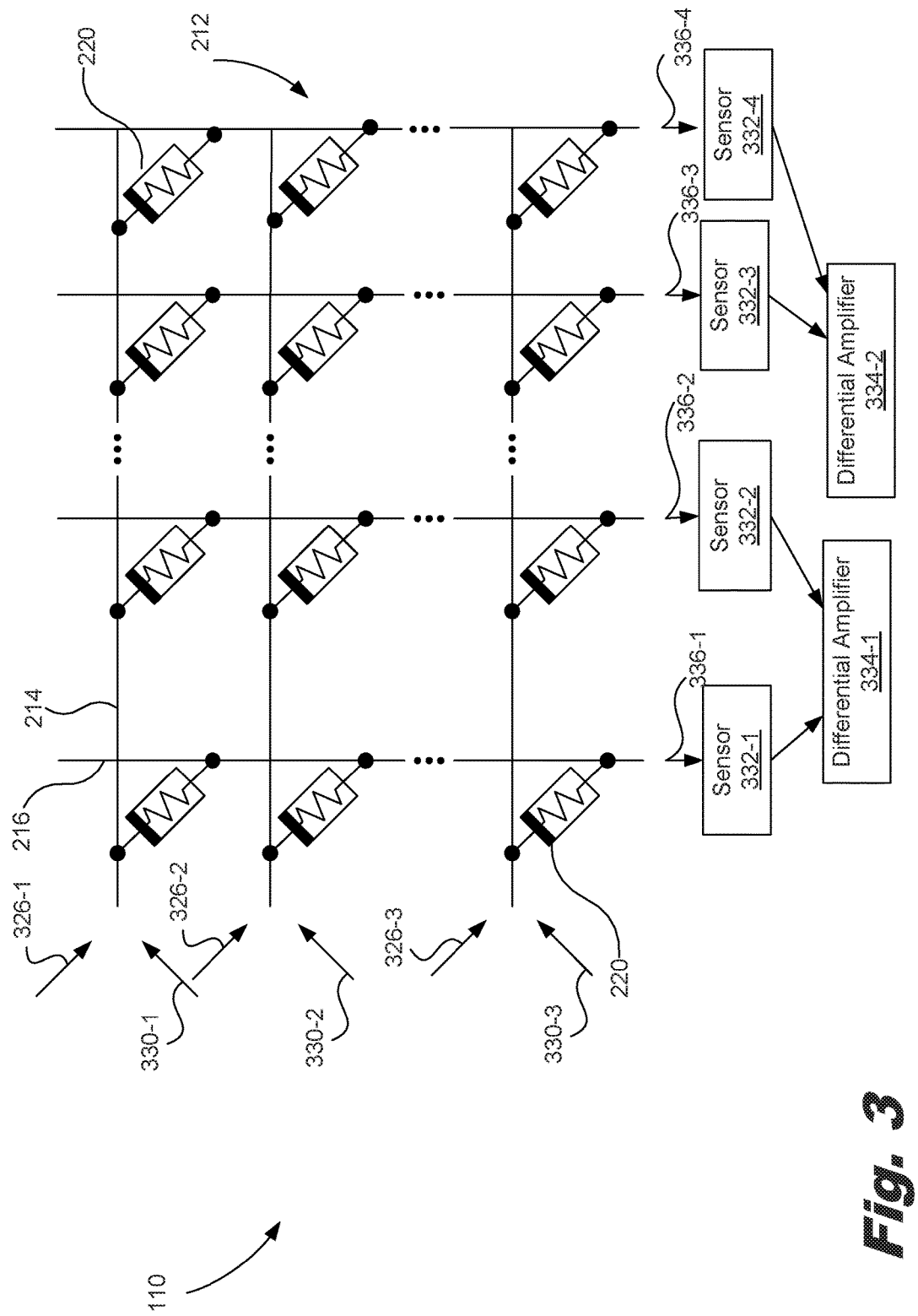
FIG. 3 is a diagram of the memristive cross product engine (CPE) of FIGS. 1 and 2, according to one example of the principles described herein.

FIG. 3 is a diagram of the memristive cross product engine (CPE) 110 of FIGS. 1 and 2, according to one example of the principles described herein. Although the memristive CPE 110 of FIG. 3 is depicted as having a circuit layout as depicted, any number of circuit layouts may be used to achieve the function of the present systems and methods. The memristive array 212 as depicted in FIG. 3 includes the row lines 214, the column lines 216, and the memristors 220 as described above in connection with FIG. 2. As mentioned above, any number of row lines 214 and column lines 216 may be included within the memristive CPE 110. In one example, the number of row lines 214 and column lines 216 included within the memristive CPE 110 may be equal or greater than the size of the skew-symmetric matrix representing the first vector.

As described above, the memristive array 212 of the CPE 110 may receive a number of different second vector signals (FIG. 2, 222). Accordingly, the memristive crossbar array 212 may include a number of row circuits connected to each row line 214 to apply the programming voltage 326, the input voltage 330, or combinations thereof.

A programming voltage 326-1, 326-2, 326-3 may be applied to each row line 214, the programming voltage 326 being a signal to set the resistance levels of the memristors 220 in a corresponding row line 214 to values that correspond with matrix entries of a skew-symmetric matrix to be used to represent a first vector in a cross product computation. In this fashion, the conductance levels of the memristors 220 may form a grid of values that map to a matrix of entry values that are to be multiplied by a vector, i.e., the second vector.

The crossbar array 212 may also receive a number of input voltages 330-1, 330-2, 330-3 that represent vector values of a second vector that is to be multiplied by the matrix represented by the programming voltages 326. As will be described below, the input voltages 330 may be used to determine the output currents and/or voltages of the individual column lines 216.

The memristive crossbar array 212 may be coupled to a number of sensors 332-1, 332-2, 332-3, the sensors 332 being represented by boxes in FIG. 3. Each column line 216 may have a corresponding sensor 332. A sensor 332 may determine a column output 336 for a column of memristors 220. For example, using Ohm's law, the input voltage 330 may be multiplied by the conductance levels (as conductance levels for example) of the memristors 220, to yield an output current 336 for a column. Each sensor 332 located at each column line may measure the output current 336 along the column line, where the output current 336 is generated upon receipt of the input voltages by memory elements located along the row line based on the conductance values of the respective memory elements. Each sensor 332 may convert the output current 336 to an output voltage. The output voltages of pairs of sensors 332 may be passed via differential amplifiers 334 that collate the measured output voltages for respective pairs of column lines to generate dimensional components of the cross product of the first vector and the second vector to yield a vector that is indicative of the result of a cross product calculation.

In this example, differential amplifier 334-1 may subtract the output voltage from sensor 332-1 from the output voltage from sensor 332-2, and differential amplifier 334-2 may subtract the output voltage from sensor 332-3 from the output voltage from sensor 332-4. Any number of circuit layouts may be used to achieve the function of subtracting output voltages from one another. In some examples, sensors 332 may include a storage component to store the measured output currents and/or voltages.

In some examples, the output currents 336 may be received for a column line (FIG. 2, 216) by sensors 332. In some examples, sensors 332 may be transimpedance amplifiers (TIAs) that convert the output current (336-1, 336-2, 336-3) from each column line to an output voltage. In some examples, a storage component, such as a capacitor, stores the converted output voltage. In some examples, the TIA 332 may also amplify the output of the memristor array (FIG. 1, 110) to a usable voltage. During operation, the output voltages from pairs of sensors 332 would be subtracted from one another. For example, the output voltage may then be passed to differential amplifiers (334-1, 334-2) that subtracts respective output voltages, as described herein. In some examples, the differential amplifiers (334-1, 334-2) may further amplify the output voltages.

Figure 4:
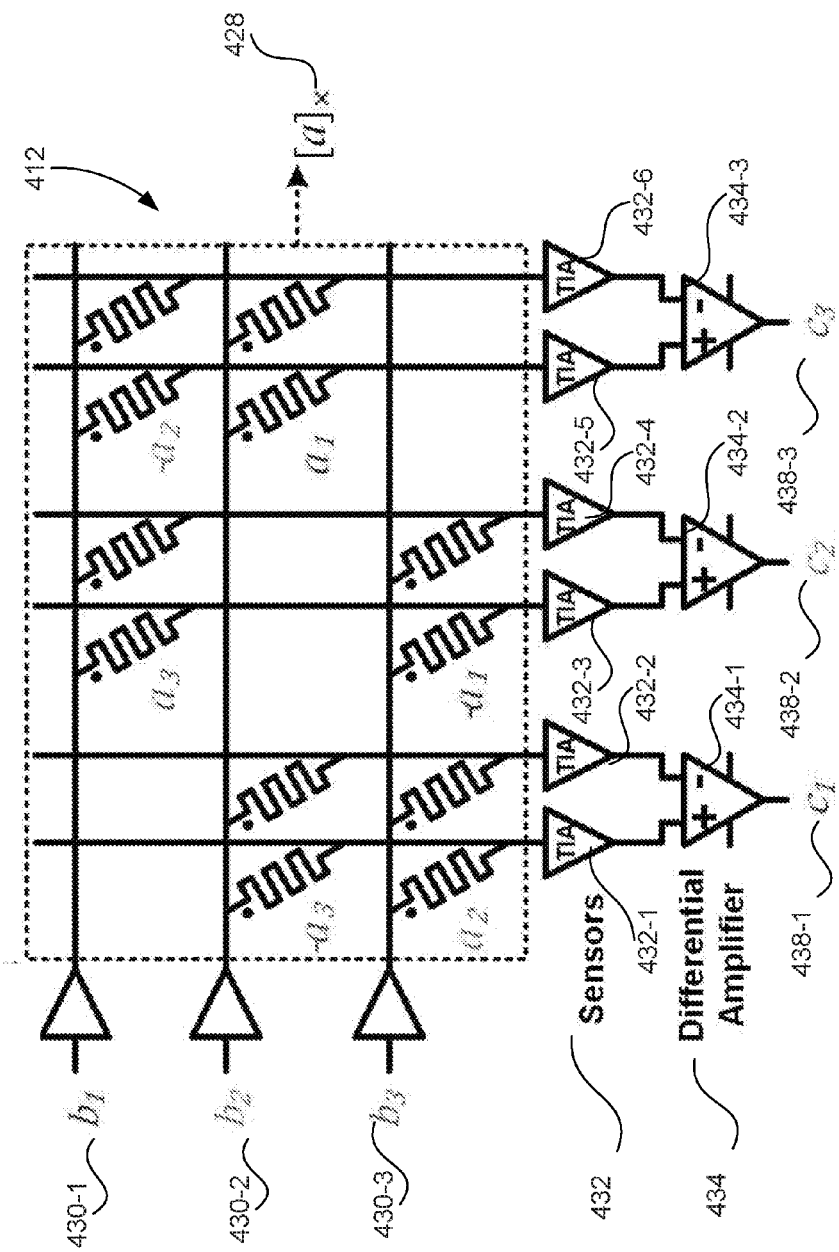
FIG. 4 is another diagram of the memristive cross product engine (CPE), according to one example of the principles described herein.

FIG. 4 is another diagram of the memristive cross product engine (CPE), according to one example of the principles described herein. As described herein, a first vector $\vec{a}=a_1 i+a_2 j+a_3 k$ may be represented as a skew-symmetric matrix $[a]_x$ as below:

$$[a]_x = \begin{bmatrix} 0 & -a_3 & a_2 \\ a_3 & 0 & -a_1 \\ -a_2 & a_1 & 0 \end{bmatrix} \quad \text{(Eqn. 4)}$$

The memristive crossbar array 412 may be used in computing a cross product of the first vector $\vec{a}$ represented by a skew-symmetric matrix $[a]_x$ 428 with a second vector $\vec{b}=b_1 i+b_2 j+b_3 k$. The memristive crossbar array 412 includes a number of electrically conductive row lines and a number of electrically conductive column lines that are perpendicular to the electrically conductive row lines. A number of memristive memory devices are located at the junctions (or intersections) and electrically couple the row lines to the column lines. As illustrated, conductance values of memristors within the crossbar array 412 represent the matrix values for the skew symmetric matrix 428. A programming voltage is applied at each memory element to change a conductance value of the memory element, where the conductance value represents a respective entry in the skew symmetric matrix 428 representing the first vector.

For representing the negative values of the vector $[a]_x$ in Eqn. 4, two column lines per output vector component $c_i$ are used with one sensor or transimpedance amplifier (TIA) per column line to measure the output current. A differential amplifier is then used to subtract both TIA outputs, which results in the respective vector component. As illustrated in FIG. 4, the diagonal does not contain any memristor elements, however, a variation of this architecture may include a very high resistive memristor element so that the array can be also used for computing dot products. The cell structures in FIG. 4 are 1R cells, but variations of this may include, for example, 1S1R, 1T1R, or nT1R for reducing sneak-path currents during cell programming.

An input voltage may be passed along each row line, the combination of input voltages 430-1, 430-2, 430-3 representing the dimensional components $b_1$, $b_2$, $b_3$ of the second vector $\vec{b}$. The cross product of the first vector and the second vector may be replicated by multiplying the conductance of each memristor by the second vector voltages, and collecting the outputs along column lines of the memristive crossbar array 412 as output currents.

As described herein, each column line may have a corresponding sensor 432. A sensor 432 may determine a column output for a column of memristors. For example, using Ohm's law, the input voltages 430 may be multiplied by the conductance levels (as conductance levels for example) of the memristors, to yield an output current for a column. Each sensor 432 located at each column line may measure the output current along the column line, where the output current is generated upon receipt of the input voltages by memory elements located along the row line based on the resistance values of the respective memory elements. Each sensor 432 may convert the output current to an output voltage. In some examples, sensors 432 may be transimpedance amplifiers (TIAs) that convert the output current from each column line to an output voltage. The output voltage may then be passed through differential amplifiers 434 that subtract respective output voltages.

For example, sensor 432-1 may receive output current that represents the product $a_2 b_3$ and sensor 432-2 may receive output current that represents the product $a_3 b_2$. Sensors 432-1 and 432-2 may convert the received output currents to output voltages that represent the respective products. Differential amplifier 434-1 computes the difference between the output voltage from sensor 432-1 and sensor 432-2 to determine the first dimensional component $c_1=a_2 b_3-a_3 b_2$ 438-1 of the vector $\vec{c}$ that is the cross product of the first vector $\vec{a}$ and the second vector $\vec{b}$.

Similarly, sensor 432-3 may receive output current that represents the product $a_3b_1$ and sensor 432-4 may receive output current that represents the product $a_1b_3$. Sensors 432-3 and 432-4 may convert the received output currents to output voltages that represent the respective products. Differential amplifier 434-2 computes the difference between the output voltage from sensor 432-3 and sensor 432-4 to determine the second dimensional component $c_2=a_3b_1-a_1b_3$ 438-2 of the vector $\vec{c}$.

Likewise, sensor 432-5 may receive output current that represents the product $a_2b_1$ and sensor 432-6 may receive output current that represents the product $a_1b_2$. Sensors 432-5 and 432-6 may convert the received output currents to output voltages that represent the respective products. Differential amplifier 434-3 computes the difference between the output voltage from sensor 432-5 and sensor 432-6 to determine the third dimensional component $c_3=a_2b_1-a_1b_2$ 438-3 of the vector $\vec{c}$.

Figure 5:
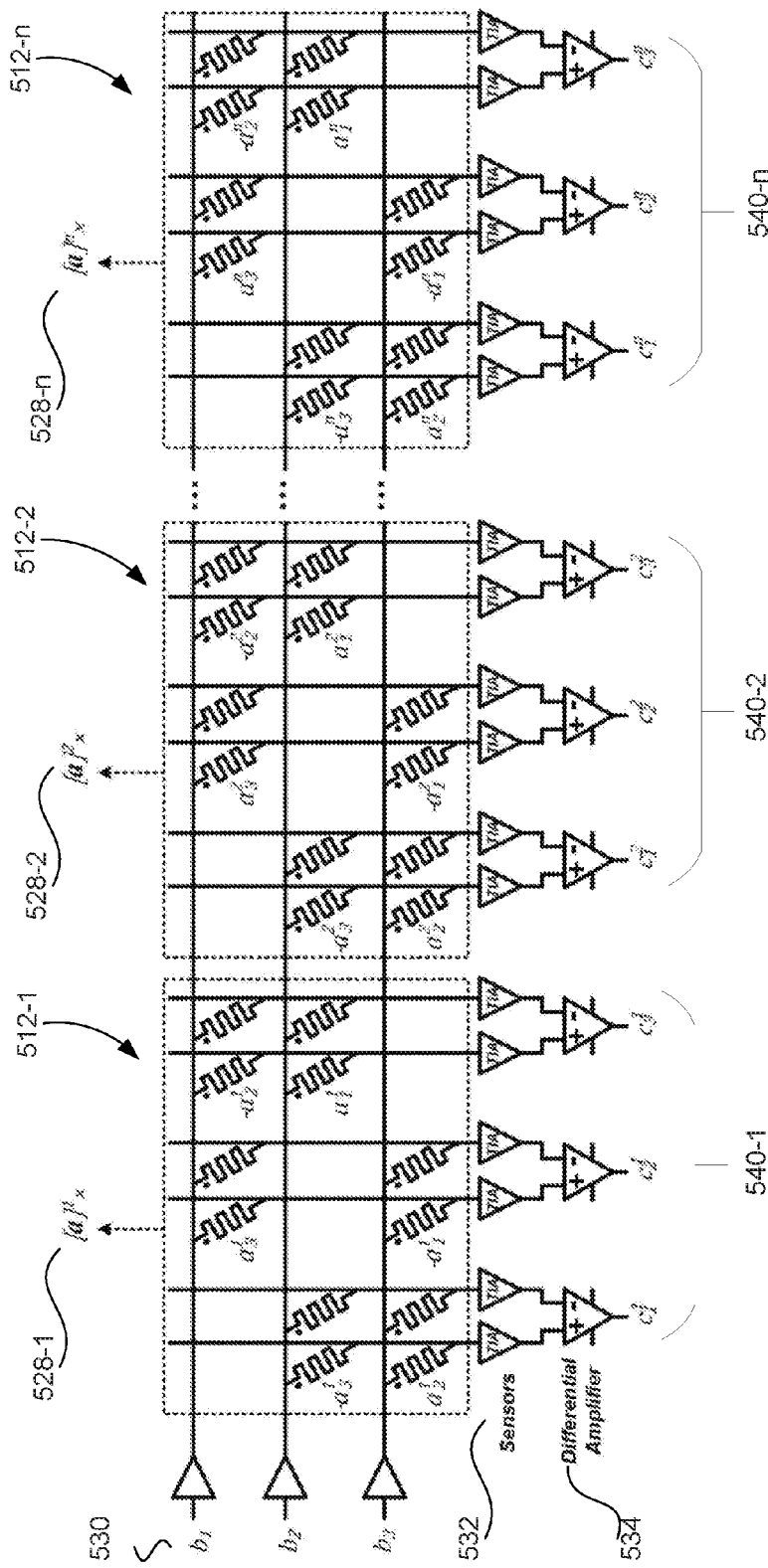
FIG. 5 is a diagram of the memristive cross product engine (CPE) with a concatenated plurality of cross bar arrays to compute a plurality of cross products, according to one example of the principles described herein.

FIG. 5 is a diagram of the memristive cross product engine (CPE) with a concatenated plurality of cross bar arrays to compute a plurality of cross products, according to one example of the principles described herein. One possible adaptation of the cross product engine (CPE) is the ability to compute various cross products in parallel. For example, a plurality of cross products, $\vec{a}_1 \times \vec{b}, \vec{a}_2 \times \vec{b}, \ldots, \vec{a}_n \times \vec{b}$, may be computed in parallel by connecting a plurality of memristive cross product engines (as described with reference to FIG. 4), via row lines. For example, vectors $\vec{a}_1 = a_1^1 i + a_2^1 j + a_3^1 k, \vec{a}_2 = a_1^2 i + a_2^2 j + a_3^2 k, \ldots, \vec{a}_n = a_1^n i + a_2^n j + a_3^n k$, may be represented by respective skew-symmetric matrices, $$[a]_x^1 = \begin{bmatrix} 0 & -a_3^1 & a_2^1 \\ a_3^1 & 0 & -a_1^1 \\ -a_2^1 & a_1^1 & 0 \end{bmatrix}, [a]_x^2 = \begin{bmatrix} 0 & -a_3^2 & a_2^2 \\ a_3^2 & 0 & -a_1^2 \\ -a_2^2 & a_1^2 & 0 \end{bmatrix}, \ldots, \quad \text{(Eqn. 5)}$$

$$[a]_x^n = \begin{bmatrix} 0 & -a_3^n & a_2^n \\ a_3^n & 0 & -a_1^n \\ -a_2^n & a_1^n & 0 \end{bmatrix}$$

The memristive crossbar array 512-1 may be used in computing a cross product of the first vector $\vec{a}_1$ represented by a skew-symmetric matrix $[a]_x^1$ 528-1 with a vector $\vec{b}=b_1 i+b_2 j+b_3 k$, whose dimensional components $b_1, b_2, b_3$ 530 may be input as an input voltage passed along each row line. As described with reference to FIG. 4, each column line may have corresponding sensors 532 to measure the output current along the column line, where the output current is generated upon receipt of the input voltages by memory elements located along the row line based on the resistance values of the respective memory elements. Each sensor 532 may convert the output current to an output voltage. In some examples, sensors 532 may be transimpedance amplifiers (TIAs) that convert the output current from each column line to an output voltage. The output voltage may then be passed through differential amplifiers 534 that subtract respective output voltages as described herein. Accordingly, dimensional components $c_1^1, c_2^1, c_3^1$ 540-1 of the vector $\vec{c}_1$ representing the cross product of $\vec{a}_1$ and $\vec{b}$ may be computed.

Similarly, the memristive crossbar array 512-2 may be used in computing a cross product of the second vector $\vec{a}_2$ represented by a skew-symmetric matrix $[a]_x^2$ 528-2 with a vector $\vec{b}=b_1 i+b_2 j+b_3 k$, whose dimensional components $b_1, b_2, b_3$ 530 may be input as an input voltage passed along each row line. As the memristive crossbar arrays 512-1, 512-2 are connected via the row lines, the same input voltage suffices. Sensors 532 measure the output current along the column line, where the output current is generated upon receipt of the input voltages by memory elements located along the row line based on the resistance values of the respective memory elements. Each sensor 532 may convert the output current to an output voltage. Sensors 532 may be transimpedance amplifiers (TIAs) that convert the output current from each column line to an output voltage. The output voltage passes through differential amplifiers 534 that subtract respective output voltages as described herein. Accordingly, dimensional components $c_1^2, c_2^2, c_3^2$ 540-2 of the vector $\vec{c}_2$ representing the cross product of $\vec{a}_2$ and $\vec{b}$ may be computed.

Likewise, the memristive crossbar array 512-n may be used in computing a cross product of the third vector $\vec{a}_3$ represented by a skew-symmetric matrix $[a]_x^3$ 528-n with a vector $\vec{b}=b_1 i+b_2 j+b_3 k$, whose dimensional components $b_1, b_2, b_3$ 530 may be input as an input voltage passed along each row line. As the memristive crossbar arrays 512-1, 512-2, ..., 512-n are connected via the row lines, the same input voltage suffices. Sensors 532 to measure the output current along the column line, where the output current is generated upon receipt of the input voltages by memory elements located along the row line based on the resistance values of the respective memory elements. Each sensor 532 may convert the output current to an output voltage. Sensors 532 may be transimpedance amplifiers (TIAs) that convert the output current from each column line to an output voltage. The output voltage passes through differential amplifiers 534 that subtract respective output voltages as described herein. Accordingly, dimensional components $c_1^n, c_2^n, c_3^n$ 540-n of the vector $\vec{c}_n$ representing the cross product of $\vec{a}_n$ and $\vec{b}$ may be computed in parallel.

Such parallel computations of a plurality of cross products are particularly important in applications where multiple cross product calculations are needed, such as when computing torque or momentum in various coordinate locations on 3D systems.

Figure 6:
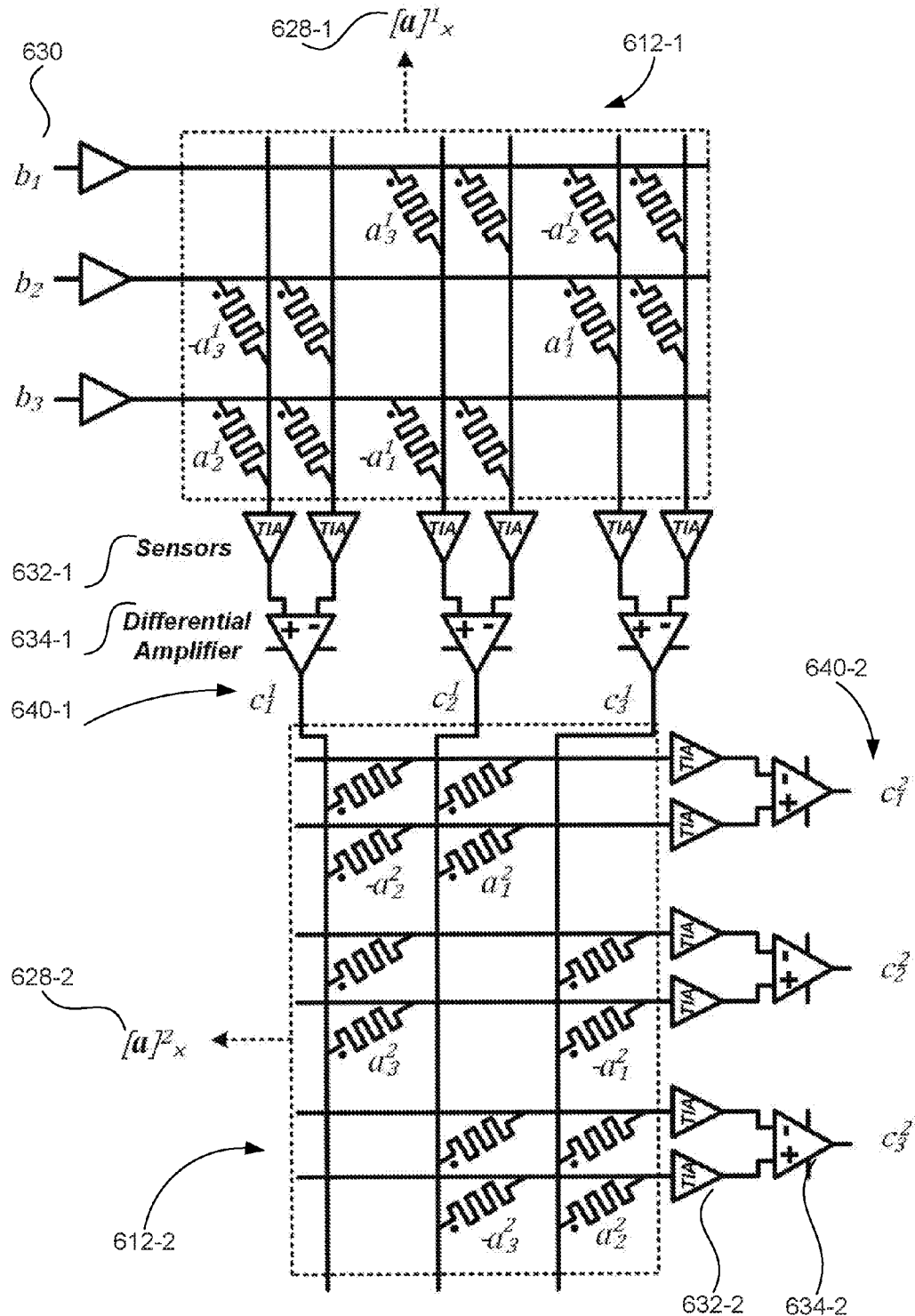
FIG. 6 is a diagram of the memristive cross product engine (CPE) to compute a cross product of a cross product, according to one example of the principles described herein.

FIG. 6 is a diagram of the memristive cross product engine (CPE) to compute a cross product of a cross product, according to one example of the principles described herein. For example, for vectors $\vec{a}_1, \vec{a}_2, \vec{b}$, a cross product of a cross product may be computed as $\vec{a}_2 \times (\vec{a}_1 \times \vec{b})$, may be computed using the memristive cross product engine (CPE). A cross product of a cross product may be useful in many applications involving vector calculus, such as the triple vector product. An example array architecture capable of achieving this is illustrated in FIG. 6. In this configuration, the vector output of the first cross product is provided as the input to a second array, where the second cross product is performed.

As described herein, a memristive crossbar array 612-1 may be used in computing a cross product of the first vector $\vec{a}_1$ represented by a skew-symmetric matrix $[a]_x^1$ 628-1 with a vector $\vec{b}=b_1 i+b_2 j+b_3 k$, whose dimensional components $b_1, b_2, b_3$ 630 may be input as an input voltage passed along each row line of the crossbar array 612-1. As described with reference to FIG. 4, each column line of the crossbar array 612-1 may have corresponding sensors 632-1 to measure the output current along the column line, where the output current is generated upon receipt of the input voltages by memory elements located along the row line based on the resistance values of the respective memory elements. Each sensor 632-1 may convert the output current to an output voltage. In some examples, sensors 632-1 may be transimpedance amplifiers (TIAs) that convert the output current from each column line to an output voltage. The output voltage may then be passed through differential amplifiers 634-1 that subtract respective output voltages as described herein. Accordingly, dimensional components $c_1^1$, $c_2^1$, $c_3^1$ 640-1 of the vector $\vec{c}_1$ representing the cross product of $\vec{a}_1$ and $\vec{b}$ may be computed.

Next, the memristive crossbar array 612-2 may be used in computing a cross product of the second vector $\vec{a}_2$ represented by a skew-symmetric matrix $[a]_x^2$ 628-2 with the vector $\vec{c}_1 = \vec{a}_1 \times \vec{b}$. The dimensional components $c_1^1$, $c_2^1$, $c_3^1$ 640-1 of the vector $\vec{c}_1$ were obtained previously, and may be input as an input voltage passed along each row line of the memristive crossbar array 612-2.

As described with reference to FIG. 4, each column line of the crossbar array 612-2 may have corresponding sensors 632-2 to measure the output current along the column line, where the output current is generated upon receipt of the input voltages by memory elements located along the row line based on the resistance values of the respective memory elements. Each sensor 632-2 may convert the output current to an output voltage. In some examples, sensors 632-2 may be transimpedance amplifiers (TIAs) that convert the output current from each column line to an output voltage. The output voltage may then be passed through differential amplifiers 634-2 that subtract respective output voltages as described herein. Accordingly, dimensional components $c_1^2$, $c_2^2$, $c_3^2$ 640-2 of the vector $\vec{c}_2$ representing the cross product of the cross product, $\vec{a}_2 \times (\vec{a}_1 \times \vec{b})$, may be computed.

Although the cross product of a cross product is described with respect to $\vec{a}_2 \times (\vec{a}_1 \times \vec{b})$, the architecture may be extended to a series of cross products of cross products and may be combined with parallel cross product computation. Also, for example, such an architecture may be combined with the parallel architecture described with reference to FIG. 5 to perform large scale parallel computations of cross products of multiple cross products. Also, for example, any of the array configurations described herein (e.g., FIGS. 5, 6) may be stacked on multiple layers to increase density and may also be configure in other possible orientations that would reduce the number of peripheral components.

As described herein, the memristive cross product engine (CPE) requires the cells in the skew-symmetric matrix representation of the vectors to be programmed to the respective values of the matrix. Such a process is generally referred to as training or programming. Such a programming step may be achieved via closed-loop adaptive pulse-and-verify or other programming algorithms implemented in an FPGA or other digital logic control unit. In some examples, a single memristor 1T1R cell may exhibit multiple level capability, where more than 40 conductance levels may be programmed through a 100× dynamic range. This demonstrates that numbers may indeed be represented by memristor cell conductance values for computing cross products. After the programming step, the cross product computation step follows, where the vector product is computed for all columns simultaneously by applying the voltages to the row lines and measuring the output vector from the column lines.

Figure 7:
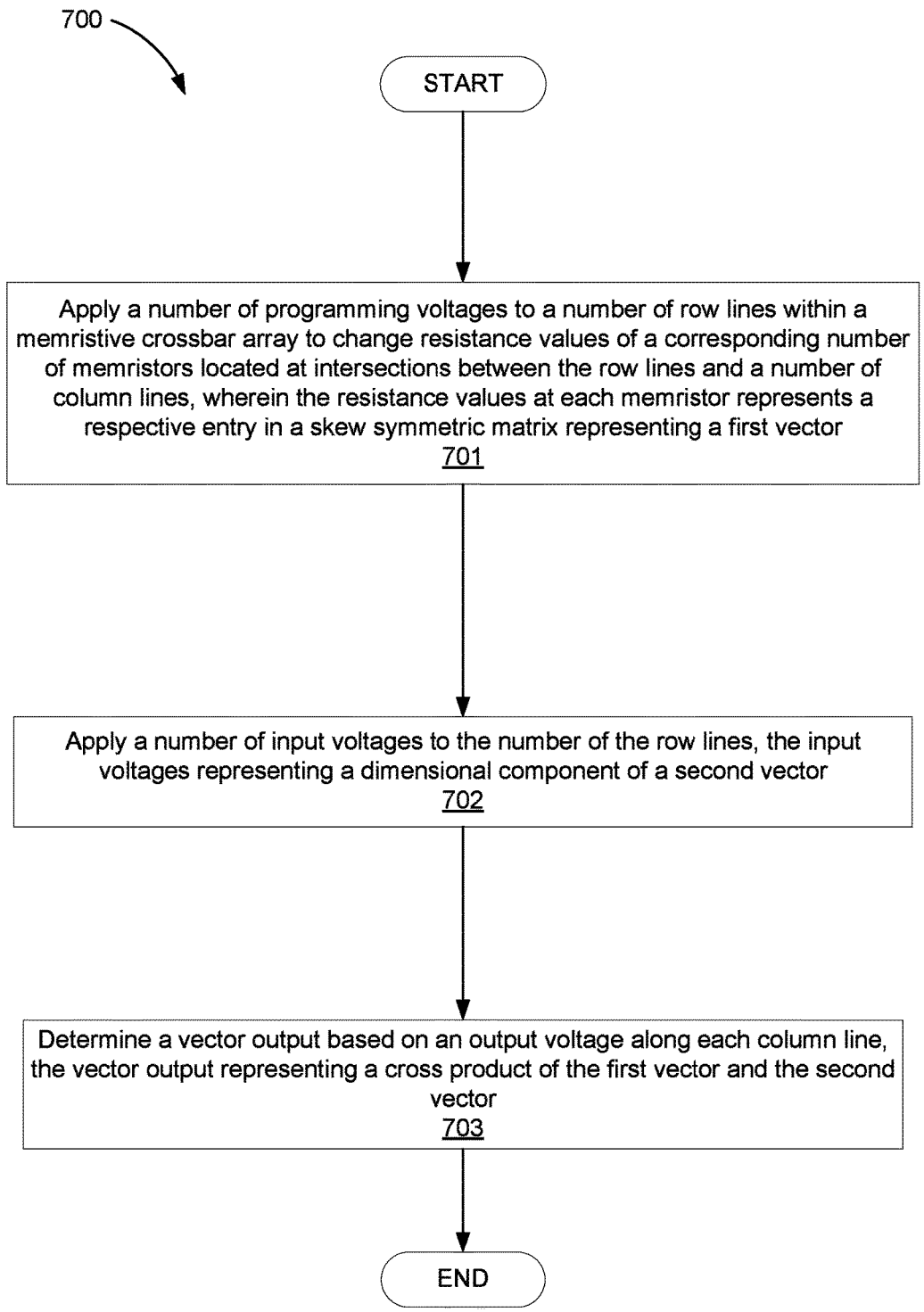
FIG. 7 is a flowchart showing a method of obtaining a cross product using a memristive cross product engine (CPE), according to one example of the principles described herein.

FIG. 7 is a flowchart showing a method of obtaining a cross product using a memristive cross product engine (CPE), according to one example of the principles described herein. In some examples, such an example method may be implemented by a system such as, for example, system 100 of FIG. 1.

At 701, a number of programming voltages are applied to a number of row lines within a memristive crossbar array to change resistance values of a corresponding number of memristors located at intersections between the row lines and a number of column lines, where the conductance values at each memristor represents a respective entry in a skew symmetric matrix representing a first vector.

At 702, a number of input voltages are applied to the number of the row lines, the input voltages representing a dimensional component of a second vector.

At 703, a vector output is determined based on an output voltage along each column line, the vector output representing a cross product of the first vector and the second vector.

Examples of the disclosure provide a generalized system for random projection in a large hash universe. The generalized system significantly reduces capital expenses and associated administrative costs, improves business application users' productivity and overall IT staff efficiency, enables responses to legal and compliance requests quickly and effectively, and allows data to be leveraged to its highest value. Upon completion of the data archival process as described herein, the production database becomes smaller in size and may be maintained more efficiently.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein.

The invention claimed is:

1. A memristive cross product engine, comprising:
    a crossbar array of memristive memory elements comprising:
    a number of row lines;
    a number of column lines perpendicular to the row lines, a memory element located at each intersection of a row line and a column line, and wherein:
        a programming voltage applied at each memory element to change a resistance value of the memory element, wherein the resistance value represents a respective entry in a skew symmetric matrix representing a first vector, and
        an input voltage applied along each row line represents a dimensional component of a second vector;
    a sensor located at each column line to measure output voltage along the column line, wherein the output voltage is generated by applying input voltages received by memory elements located along the row line to resistance values of the respective memory elements; and
    a differential amplifier connected to pairs of sensors to collate measured output voltages for respective pairs of column lines to generate dimensional components of the cross product of the first vector and the second vector.

2. The engine of claim 1, further comprising a number of row circuits connected to each row line to apply the programming voltage and the input voltage to a number of corresponding memristive memory elements.

3. The engine of claim 1, further comprising a number of column circuits connected to each column line to receive the output voltage from a number of corresponding memristive memory elements.

4. The engine of claim 1, further comprising concatenating, along the row lines, a plurality of cross bar arrays to generate dimensional components of a plurality of cross products of the first vector and a plurality of additional vectors.

5. The engine of claim 1, further comprising a second cross bar array connected to the first cross bar array, and wherein a second programming voltage applied at each memory element changes the resistance value of the memory element of the second cross bar array to represent a respective entry in a second skew symmetric matrix representing a third vector, and wherein a second input voltage applied along each row line represents a dimensional component of the output vector.

6. The engine of claim 1, wherein:
applying the number of programming voltages occurs in a training mode; and
applying the number of input voltages occurs in an operational mode.

7. A method of obtaining a cross product using a memristive cross product engine, the method comprising:
applying a number of programming voltages to a number of row lines within a memristive crossbar array to change resistance values of a corresponding number of memristors located at intersections between the row lines and a number of column lines, wherein the resistance values at each memristor represents a respective entry in a skew symmetric matrix representing a first vector;
applying a number of input voltages to the number of the row lines, the input voltages representing a dimensional component of a second vector;
determining a vector output based on an output voltage along each column line, the vector output representing a cross product of the first vector and the second vector.

8. The method of claim 7, in which determining a vector output further comprises:
collating output voltages for respective pairs of column lines to generate dimensional components of the vector output.

9. The method of claim 7, wherein:
applying the number of programming voltages occurs in a training mode; and
applying the number of input voltages occurs in an operational mode.

10. The method of claim 7, comprising:
concatenating, along the row lines, a plurality of cross bar arrays; and
determining, using the concatenated cross bar arrays, a plurality of cross products of the first vector and a plurality of additional vectors.

11. The method of claim 7, comprising:
connecting a second cross bar array to the first cross bar array;
applying a second programming voltage at each memory element of the second cross bar array to change the resistance value to represent a respective entry in a second skew symmetric matrix representing a third vector;
applying a second input voltage applied along each row line to represent a dimensional component of the vector output; and
determining a second vector output based on output voltages along each column line of the second cross bar array, the second vector output representing a cross product of the third vector with the vector output.

12. The method of claim 7, comprising storing the vector output representing the cross product of the first vector and the second vector.

13. A computing device for determining a cross product, comprising:
a processor; and
a memristive crossbar array of memristive memory elements coupled to the processor, the memristive crossbar array comprising:
a number of row lines;
a number of column lines perpendicular to the row lines, a memory element located at each intersection of a row line and a column line, wherein each memristive element receives:
a programming voltage applied at each memory element to change a resistance value of each memory element to represent a respective entry in a skew symmetric matrix representing a first vector, and
an input voltage applied along each row line to represent a dimensional component of a second vector;
a sensor located at each column line to:
measure output voltage along the column line, wherein the output voltage is generated upon receipt of the input voltages by memory elements located along the row line based on the resistance values of the respective memory elements; and
a differential amplifier connected to pairs of sensors to:
collate measured output voltages for respective pairs of column lines to generate dimensional components of the cross product of the first vector and the second vector.

14. The computing device of claim 13, further comprising a storage component to store the measured output voltages.

15. The computing device of claim 13, further comprising a number of row circuits connected to each row line to apply the programming voltage and the input voltage to a number of corresponding memristive memory elements.

16. The computing device of claim 13, further comprising a number of column circuits connected to each column line to receive the output voltage from a number of corresponding memristive memory elements.

17. The computing device of claim 13, further comprising concatenating, along the row lines, a plurality of cross bar arrays to generate dimensional components of a plurality of cross products of the first vector and a plurality of additional vectors.

18. The computing device of claim 13, further comprising:
connecting a second cross bar array to the first cross bar array;
applying a second programming voltage at each memory element of the second cross bar array to change the resistance value to represent a respective entry in a second skew symmetric matrix representing a third vector;
applying a second input voltage applied along each row line to represent a dimensional component of the vector output; and determining a second vector output based on output voltages along each column line of the second cross bar array, the second vector output representing a cross product of the third vector with the vector output.

19. The computing device of claim 13, wherein:

applying the number of programming voltages occurs in a training mode; and applying the number of input voltages occurs in an operational mode.

20. The computing device of claim 13, wherein the sensor located at each column line is a transimpedance amplifier (TIA) that converts an output current from each column line to generate the output voltage.

* * * * *